US009118339B2

(12) United States Patent
Shrivastava et al.

(10) Patent No.: US 9,118,339 B2
(45) Date of Patent: Aug. 25, 2015

(54) COMPANDING M-DIGITAL-TO-ANALOG CONVERTER (DAC) FOR A PIPELINED ANALOG-TO-DIGITAL CONVERTER (ADC)

(71) Applicant: Broadcom Corporation, Irvine, CA (US)

(72) Inventors: Ayaskant Shrivastava, Irvine, CA (US); Chun-Ying Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 102 days.

(21) Appl. No.: 13/930,922

(22) Filed: Jun. 28, 2013

(65) Prior Publication Data

US 2014/0340252 A1    Nov. 20, 2014

Related U.S. Application Data

(60) Provisional application No. 61/824,195, filed on May 16, 2013.

(51) Int. Cl.
*H03M 1/12* (2006.01)
*H03M 1/06* (2006.01)
*H03M 1/00* (2006.01)

(52) U.S. Cl.
CPC . *H03M 1/12* (2013.01); *H03M 1/00* (2013.01); *H03M 1/0695* (2013.01)

(58) Field of Classification Search
CPC ........ H03M 1/12; H03M 1/00; H03M 1/0695
USPC .......... 341/155, 110, 120, 118, 122, 161, 162
See application file for complete search history.

(56) References Cited

U.S. PATENT DOCUMENTS 7,457,378 B1 * 11/2008 Sher et al. ...................... 375/345
2008/0238737 A1 * 10/2008 Abugharbieh et al. ....... 341/110

* cited by examiner

*Primary Examiner* — Joseph Lauture
(74) *Attorney, Agent, or Firm* — Sterne, Kessler, Goldstein & Fox P.L.L.C.

(57) ABSTRACT

The present disclosure provides for an analog-to-digital converter (ADC) which selectively compresses an analog input signal to improve noise performance and dynamic input range. The ADC selectively scales an analog input signal when it is closer to an expected value of one or more signal metrics more than when it is further from the expected value of the one or more signal metrics. For example, during the conversion process, the ADC amplifies the analog input signal when it is closer to a mean value μ by a gain factor while selectively adjusting the gain factor when the analog input signal is further from its mean value μ to selectively compress the analog input signal. This selective compression improves input noise performance and dynamic input range of the ADC when compared to the conventional ADC.

21 Claims, 7 Drawing Sheets

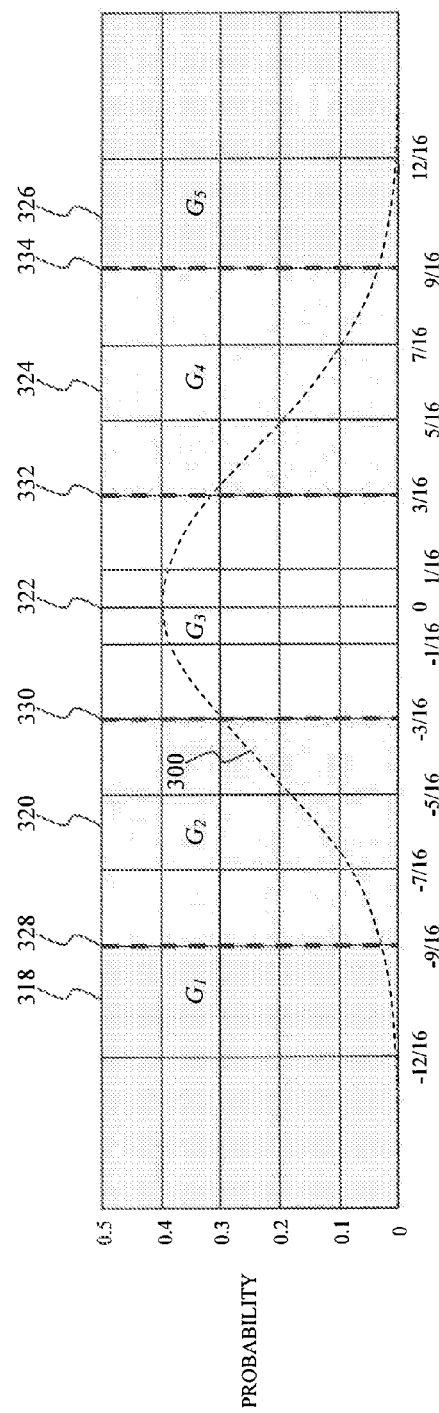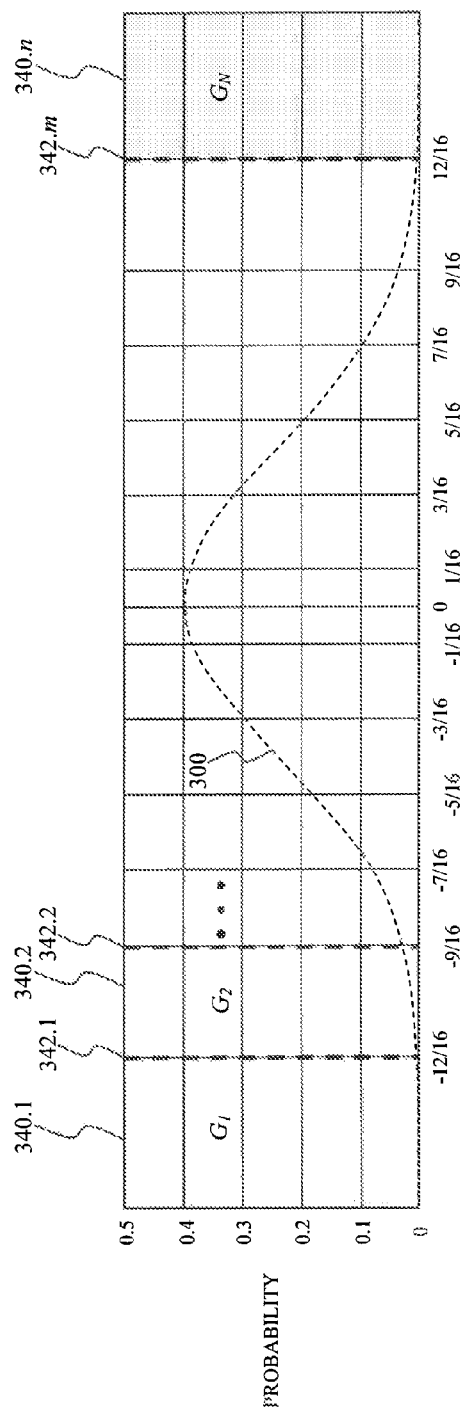
FIG. 3B
FIG. 3C

COMPANDING M-DIGITAL-TO-ANALOG CONVERTER (DAC) FOR A PIPELINED ANALOG-TO-DIGITAL CONVERTER (ADC)

CROSS-REFERENCE TO RELATED APPLICATIONS/INCORPORATION BY REFERENCE

This application claims priority to U.S. Provisional Application No. 61/824,195, filed May 16, 2013, which is incorporated herein by reference in its entirety.

BACKGROUND

1. Field of Disclosure

The disclosure relates to a pipeline analog-to-digital converter (ADC), and more specifically to selective compression of an analog input signal of the data converter to improve input noise performance and dynamic input range.

2. Related Art

Data converters are frequently used in a mixed-signal electronic system that includes an analog signal domain and a digital signal domain. The analog signal domain primarily operates upon an analog input signal while the digital signal domain primarily operates upon a digital output signal. A mechanism is required to transport signals from the analog signal domain to the digital signal domain in the mixed-signal electronic system.

Commonly, a conventional analog-to-digital converter (ADC) is used to convert an analog input signal from the analog signal domain to a digital output signal for the digital signal domain. The conventional ADC includes multiple quantization levels that are used to assign the analog input signal to a combination of bits, referred to as a codeword. The conventional ADC selects one of the quantization levels that is closest to the analog input signal and provides the combination of bits that corresponds to this selected quantization level as the digital output signal.

A ratio between a minimum quantization level and a maximum quantization level may be referred to as a dynamic input range of the conventional ADC. Often times, the dynamic input range of the conventional ADC is determined such that a maximum value of the analog input signal is less than or equal to the maximum quantization level and a minimum value of the analog input signal is greater than or equal to the minimum quantization level. When the conventional ADC is used in a wideband communication system that combines various communication signals to form communication signals that have high peak to root mean square (rms) ratios, the peaks of these communication signals determine the minimum quantization level and the maximum quantization level. In most situations, the analog input signal is significantly less than the peaks of these communication signals. As a result only a narrow range of the available dynamic input range is utilized by the conventional ADC which reduces its accuracy. Some of the outermost quantization levels, those furthest from a mean value of the analog input signal, are rarely, if ever, utilized by the conventional ADC in the wideband communication system. As an alternate, the dynamic input range of the conventional ADC can be narrowed to only cover those values of the analog input signal which are commonly observed. In this situation, when the analog input signal falls below the minimum quantization level and/or rises above the maximum quantization level, respectively, the conventional ADC saturates or clips. As a result, the digital output signal no longer accurately represents the analog input signal when clipping occurs.

BRIEF DESCRIPTION OF THE DRAWINGS/FIGURES

The present disclosure is described with reference to the accompanying drawings. In the drawings, like reference numbers indicate identical or functionally similar elements. Additionally, the left most digit(s) of a reference number identifies the drawing in which the reference number first appears.

FIG. 1 graphically illustrates a normal distribution of various analog input signals that are to be converted by the ADC to various digital output signals according to an exemplary embodiment of the present disclosure;

FIG. 3B illustrates a second exemplary operation of the gain control logic module that can be implemented as part of the exemplary pipeline ADC according to an exemplary embodiment of the present disclosure;

FIG. 3C illustrates a third exemplary operation of the gain control logic module that can be implemented as part of the exemplary pipeline ADC according to an exemplary embodiment of the present disclosure;

Figure 1:
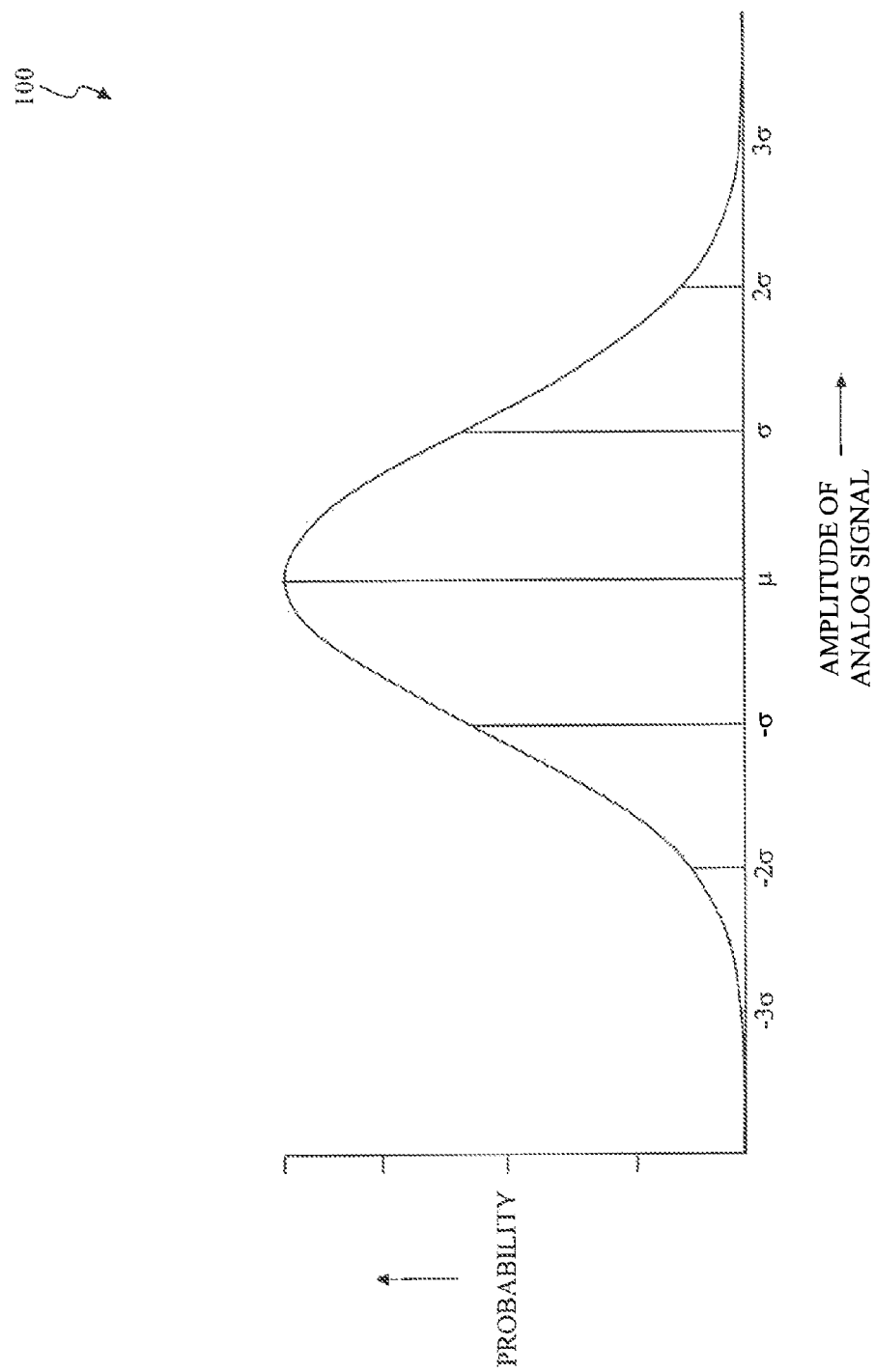

The present disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications can be made to the exemplary embodiments within the spirit and scope of the disclosure. Therefore, the Detailed Description is not meant to limit the disclosure. Rather, the scope of the disclosure is defined only in accordance with the following claims and their equivalents.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital output signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

For purposes of this discussion, the term "module" shall be understood to include at least one of software, firmware, and hardware (such as one or more circuits, microchips, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

Often times, various analog input signals that are to be converted by an analog-to-digital converter (ADC) to various digital output signals can be statistically approximated using a normal, or Gaussian, distribution; however, those skilled in the relevant art(s) will recognize that other distributions can be used to approximate the various analog input signals without departing from the spirit and scope of the present disclosure. For example, FIG. 1 graphically illustrates a probability density function of a normal distribution of various possible amplitudes of an analog input signal that is to be converted by the ADC to a digital output signal according to an exemplary embodiment of the present disclosure. In probability theory, a normal distribution 100 is a continuous probability distribution, defined on the entire real line, which has a bell-shaped probability density function, known as the Gaussian function. The normal distribution 100 is commonly encountered in practice, and is used throughout statistics, the natural sciences, and the social sciences as a simple model for complex phenomena. Additionally, in statistics and probability theory, a standard deviation σ represents a variation or "dispersion" that exists around the mean value μ. A low standard deviation indicates that the data points tend to be very close to the mean value μ; while a high standard deviation indicates that the data points are spread out over a large range of values.

As shown in FIG. 1, if the mean value μ represents the most likely analog input signal that is to be converted by the ADC, namely having an amplitude that is most likely to occur, then approximately 68.27% of the analog input signals that are to be converted by the ADC will be within one standard deviation of the most likely analog input signal. Similarly, approximately 95.45% of the analog input signals that are to be converted by the ADC will be within two standard deviations 2σ of the most likely analog input signal. Likewise, approximately 99.73% of the analog input signals that are to be converted by the ADC will be within three standard deviations 3σ of the most likely analog input signal.

Overview

The present disclosure provides for an analog-to-digital converter (ADC) which selectively compresses an analog input signal to improve noise performance and dynamic input range. The ADC selectively scales an analog input signal when it is closer to an expected value of one or more signal metrics more than when it is further from the expected value of the one or more signal metrics. For example, during the conversion process, the ADC amplifies the analog input signal when it is closer to a mean value μ by a gain factor while selectively adjusting the gain factor when the analog input signal is further from its mean value μ to selectively compress the analog input signal. This selective compression improves input noise performance and dynamic input range of the ADC when compared to the conventional ADC.

First Exemplary Pipeline Analog-to-Digital Converter (ADC)

Figure 2:
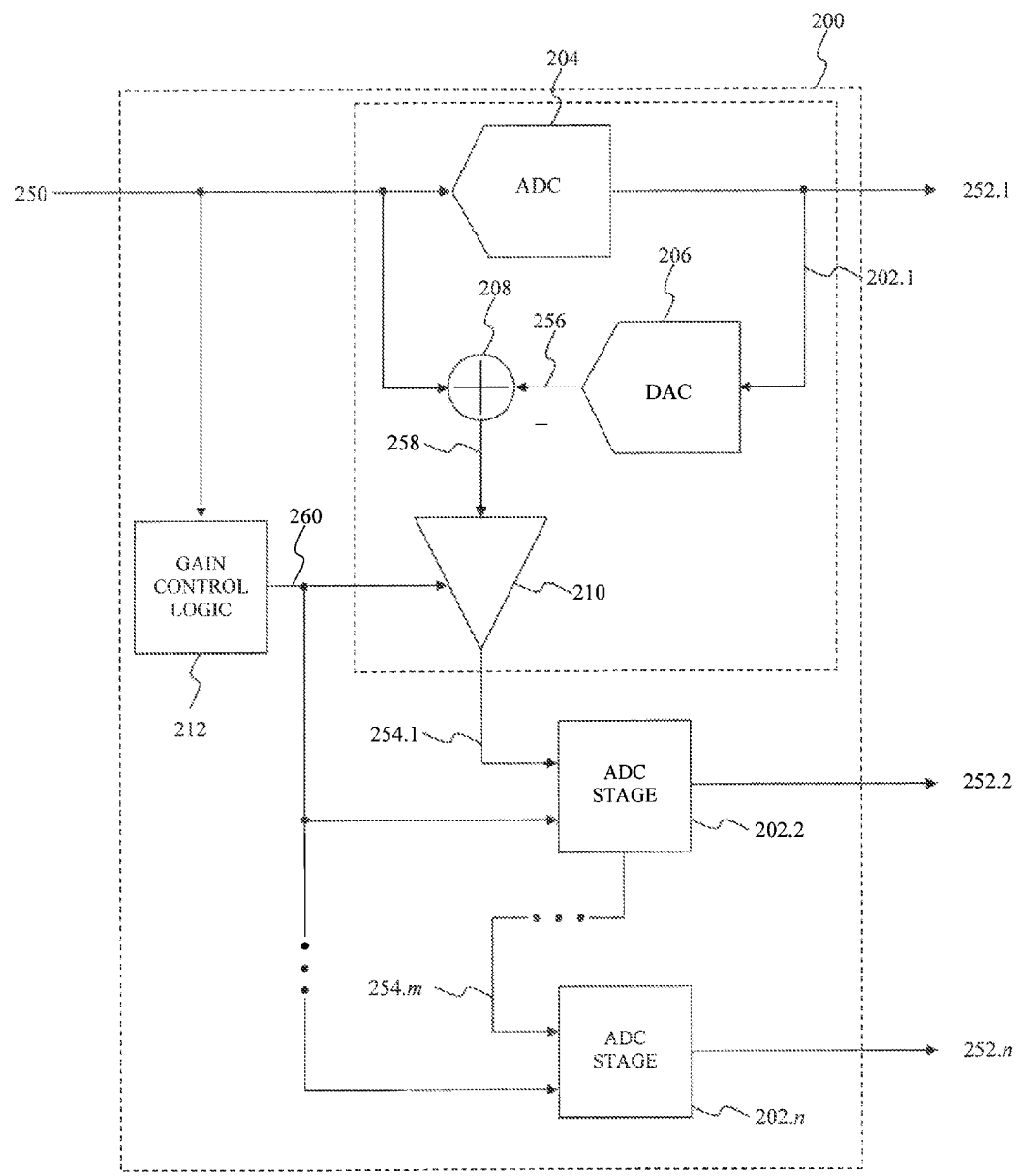
FIG. 2 illustrates a block diagram of a first exemplary pipeline analog-to-digital converter (ADC) according to an exemplary embodiment of the present disclosure.

FIG. 2 illustrates a block diagram of a first exemplary pipeline analog-to-digital converter (ADC) according to an exemplary embodiment of the present disclosure. A pipeline analog-to-digital converter (ADC) 200 converts an analog input signal 250 from a representation in an analog signal domain to a representation in a digital signal domain to provide a digital output signal 252. The pipeline ADC 200 includes ADC stages 202.1 through 202.n and a gain control logic module 212.

The ADC stages 202.1 through 202.n convert their respective analog input signals from the representation in the analog signal domain to the representation in the digital signal domain to provide the digital output signals 252.1 through 252.n. Each of the digital output signals 252.1 through 252.n represent one or more bits of the digital output signal 252. Typically those digital output signals 252.1 through 252.n with a lower index represent more significant bits than those digital output signals 252.1 through 252.n with a higher index. The ADC stages 202.1 through 202.n additionally provide analog residual signals 254.1 through 254.m to subsequent ADC stages from among the ADC stages 202.1 through 202.n. The analog residual signals 254.1 through 254.*m* represent a difference between their respective analog input signals and their respective digital output signals 252.1 through 252.*n*. The ADC stages 202.1 through 202.*n* amplify the analog residual signals 254.1 through 254.*m* by respective gain factors such that subsequent ADC stages 202.1 through 202.*n* can accurately convert their respective analog residual signals 254.1 through 254.*m* into their respective digital output signals 252.1 through 252.*n*. The respective gain factors are selectively chosen based upon the analog input signal 250. When one or more signal metrics of the analog input signal 250 are closer to their expected values, the analog input signal 250 is amplified by higher respective gain factors than when the one or more signal metrics of the analog input signal 250 are further from their expected values. For example, when the analog input signal 250 is closer to its mean value p, the analog input signal 250 is amplified by higher respective gain factors than when the analog input signal 250 is further from the mean value.

The ADC stages 202.1 through 202.*n* are implemented in a substantially similar manner; therefore, only the ADC stage 202.1 is to be discussed in further detail below. The ADC stage includes an ADC 204, a digital-to-analog converter (DAC) 206, a combination module 208, and an amplifier module 210. The ADC 204 converts its respective analog input signal, such as the analog input signal 250, from a representation in an analog signal domain to a representation in a digital signal domain to provide a respective one of the digital output signals 252.1 through 252.*n*, such as the digital output signal 252.1 to provide an example.

The DAC 206 converts the respective one of the digital output signals 252.1 through 252.*n*, such as the digital output signal 252.1 to provide an example, from the representation in the digital signal domain to a representation in the analog signal domain to provide an analog output signal 256. The analog output signal 256 represents a representation of the respective one of the digital output signals 252.1 through 252.*n* which has been converted from the digital signal domain to the analog signal domain.

The combination module 208 subtracts the analog output signal 256 to provide a difference signal 258 from the respective analog input signal of the ADC stage 202.1, such as the analog input signal 250, to provide a difference signal 258. The difference signal 258 represents a difference between the respective analog input signal and the analog output signal 256.

The amplifier module 210 amplifies the difference signal 258 in accordance with a gain factor 260 to provide a respective one of the analog residual signals 254.1 through 254.*m*, such as the analog residual signal 254.1 to provide an example. Typically, the amplifier module 210 amplifies the difference signal 258 such that the respective one of the analog residual signals 254.1 through 254.*m* lies with a dynamic range of a respective ADC 204 of a subsequent ADC stage from among the ADC stages 202.1 through 202.*n*. For example, if the digital output signal 252.1 represents the first k bits of the digital output signal 252, then the amplifier module 210 amplifies the difference signal 258 by a first scaling factor of $2^k$ such that the ADC stage 202.2 converts the analog residual signal 254.1 into the digital output signal 252.2 which represents the next k bits of the digital output signal 252. As another example, if the digital output signal 252.1 represents the first k bits of the digital output signal 252, then the amplifier module 210 amplifies the analog output signal 256 by a second scaling factor representing a combination of the first scaling factor and the gain factor 260, which is to be discussed below, such that the ADC stage 202.2 converts the analog residual signal 254.1 into the digital output signal 252.2 which represents the next k bits of the digital output signal 252.

The gain control logic module 212 provides the gain factor 260 based upon the analog input signal 250. Although the pipeline ADC 200 is illustrated as having a single gain control logic module 212, this is for illustrative purposes only. Those skilled in the relevant art(s) will recognize that one or more of the ADC stages 202.1 through 202.*n* can each have the gain control logic module 212. In this situation, the gain control logic module 212 of each of the ADC stages 202.1 through 202.*n* determine their respective gain factor 260 based upon their respective analog input signals.

Typically, the gain control logic module 212 determines one or more signal metrics of the analog input signal 250, such as a mean, a total energy, an average power, a mean square, an instantaneous power, a root mean square, a variance, a norm, a voltage level and/or any other suitable signal metric that will be apparent by those skilled in the relevant art(s) provide some examples. Next, the gain control logic module 212 compares the one or more signal metrics with various probability density regions of an exemplary probability density function for one or more signal metrics of the analog input signal 250 to determine a corresponding probability density region. In an exemplary embodiment, the various probability density regions are stored within a memory that is accessible or part of the gain control logic module 212. Thereafter, the gain control logic module 212 selects a corresponding gain factor that corresponds to the corresponding probability density region from among multiple possible gain factors as the gain factor 260.

Figure 3A:
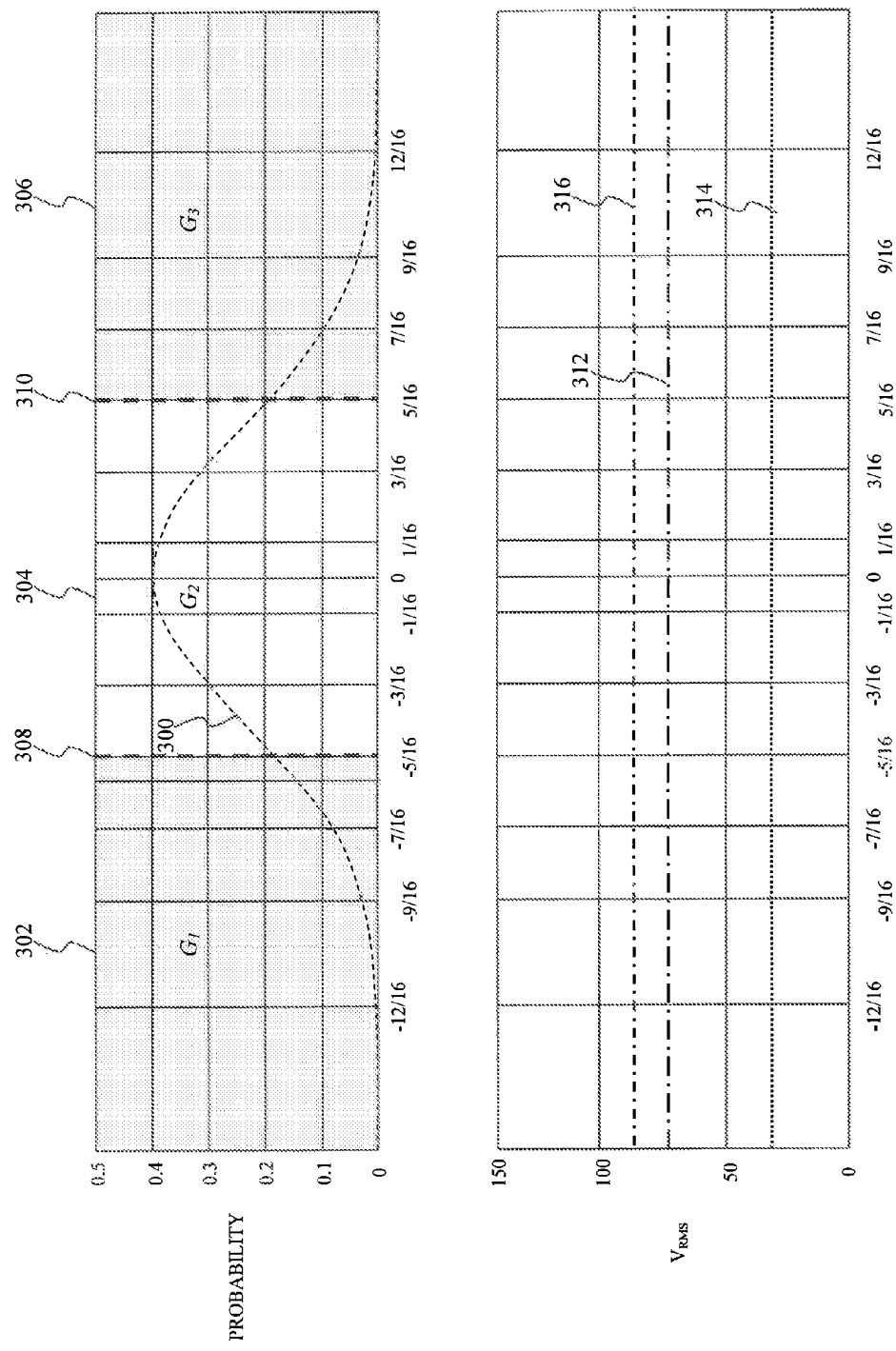
FIG. 3A illustrates a first exemplary operation of a gain control logic module that can be implemented as part of the exemplary pipeline ADC according to an exemplary embodiment of the present disclosure.

Exemplary Operations of a Gain Control Logic Module that can be Implemented as Part of the Pipeline ADC FIG. 3A illustrates a first exemplary operation of a gain control logic module that can be implemented as part of the exemplary pipeline ADC according to an exemplary embodiment of the present disclosure. A pipeline ADC, such as the pipeline ADC 200 to provide an example, scales an analog input signal, such as the analog input signal 250 to provide an example, when it is close to its expected value of one or more signal metrics more than when the analog input signal is further from its expected value of the one or more signal metrics. For example, during the conversion process, the pipeline ADC scales the analog input signal when it is closer to a mean value μ by a gain factor while selectively adjusting the gain factor for when the analog input signal is further from the mean value to selectively compress the analog input signal. In this example, the pipeline ADC scales the analog input signal by a first gain factor when it is closer to its mean value μ while attenuating the analog input signal by a second gain factor that is less than the first gain factor when it further from its mean value μ.

As shown in FIG. 3A, an exemplary probability density function 300 can be separated or partitioned into a first probability density region 302, a second probability density region 304, and a third probability density region 306. It should be noted that exemplary probability density function 300 is for illustrative purposes only. Those skilled in the relevant art(s) will recognize that other probability density functions are possible for the analog input signal that will be apparent to those skilled in the relevant art(s) without departing from the spirit and scope of the present disclosure. For example, the exemplary probability density function 300 can be characterized as having a bell-shaped probability distribution such as a Gaussian distribution, a Cauchy distribution, a Student's t-distribution, a logistic distribution, binomial distribution, a Poisson distribution, a chi-squared distribution, or any other suitable bell-shaped probability distribution that will be apparent to those skilled in the relevant art(s) without departing from the spirit and scope of the present disclosure.

The first probability density region 302 corresponds to one or more signal metrics of the analog input signal being less than a first signal metric transition 308. When the one or more signal metrics of analog input signal are within the first probability density region 302, namely are less than the first signal metric transition 308, the pipeline ADC scales the analog input signal in accordance with a first gain factor $G_1$. The second probability density region 304 corresponds to the one or more signal metrics of the analog input signal being between the first signal metric transition 308 and a second signal metric transition 310. When the one or more signal metrics of the analog input signal are within the second probability density region 304, namely between the first signal metric transition 308 and the second signal metric transition 310, the pipeline ADC scales the analog input signal in accordance with a second gain factor $G_2$. The third probability density region 306 corresponds to the one or more signal metrics of the analog input signal being greater than the second signal metric transition 310. When the one or more signal metrics of the analog input signal are within the third probability density region 306, namely are greater than the second signal metric transition 310, the pipeline ADC scales the analog input signal in accordance with a third gain factor $G_3$. In an exemplary embodiment, the first gain factor $G_1$ is equal to the second gain factor $G_2$ with both the first gain factor $G_1$ and the second gain factor $G_2$ being less than the third gain factor $G_3$.

The first signal metric transition 308 and the second signal metric transition 310 are selectively chosen such that a digital output signal, such as the digital output signal 252 to provide an example, accurately represents the analog input signal. In some situations, the analog input signal includes an exemplary averaged input noise 312. This exemplary averaged input noise 312 can represent Johnson-Nyquist noise, also referred to as thermal noise, shot noise, 1/f noise, burst noise, also referred to as impulse noise, white noise, pink noise, and/or any other suitable noise that will be apparent to those skilled in the relevant art(s) without departing from the spirit and scope of the present disclosure. The pipeline ADC converts the analog input signal including the exemplary averaged input noise 312 from the analog signal domain to the digital signal domain. During this conversion, the pipeline ADC scales the exemplary averaged input noise 312 in proportion to a selected one of the first gain factor $G_1$ through the third gain factor $G_3$ that is being used to convert the analog input signal from the analog signal domain to the digital signal domain. For example, the pipeline ADC scales the exemplary averaged input noise 312 by a factor of $G_1$ when using the first gain factor $G_1$, by a factor of $G_2$ when using the second gain factor $G_2$, and by a factor of $G_3$ when using the third gain factor $G_3$. This scaling of the exemplary averaged input noise 312 results in an exemplary averaged input noise component 314 of an exemplary averaged output noise 316.

Typically, the first signal metric transition 308 and/or the second signal metric transition 310 can be selectively chosen to attempt to minimize the exemplary averaged input noise component 314. Often times, there exists an optimal distance, or a range of optimal distances, between the first signal metric transition 308 and the second signal metric transition 310. In an exemplary embodiment, the optimal distance represents approximately two standard deviations $2\sigma$ between the first signal metric transition 308 and the second signal metric transition 310. Going beyond this optimal distance, or this range of optimal distances, can significantly reduce the exemplary averaged input noise component 314; however, in some situations, the pipeline ADC can saturate or clip when the analog input signal is within the first probability density region 302 and/or the third probability density region 306. As a result of this clipping, the digital output signal no longer accurately represents the analog input signal. In contrast, falling short of this optimal distance, or this range of optimal distances, can cause some of the analog input signals within the first probability density region 302 and/or the third probability density region 306, which will not saturate or clip the pipeline ADC, to not benefit from the scaling of the exemplary averaged input noise 312.

Alternatively, or in addition to, the first signal metric transition 308 and the second signal metric transition 310 are positioned such that the analog input signal, when within the first probability density region 302 and/or the third probability density region 306, does not cause the pipeline ADC to saturate or clip. For example, the first signal metric transition 308 and the second signal metric transition 310 can be positioned to be within a majority percentile, such as between approximately 90% to approximately 95%, of the exemplary probability density function 300 such that the analog input signal lies within the second probability density region 304 a majority of the time.

Often times, one or more signal metrics of the digital output signal, such as the exemplary averaged output noise 316 to provide an example, can be measured to determine the performance of the pipeline ADC. In these situations, the first signal metric transition 308 and/or the second signal metric transition 310 can be selectively chosen such that the one or more signal metrics of the digital output signal are within an acceptable performance level, such as below a threshold value or between threshold values to provide some examples.

FIG. 3B illustrates a second exemplary operation of the gain control logic module that can be implemented as part of the exemplary pipeline ADC according to an exemplary embodiment of the present disclosure. As shown in FIG. 3B, the exemplary probability density function 300 can be separated or partitioned into a first probability density region 318, a second probability density region 320, a third probability density region 322, a fourth probability density region 324, and a fifth probability density region 326.

The first probability density region 318 corresponds to one or more signal metrics of the analog input signal being less than a first signal metric transition 328. When the one or more signal metrics of analog input signal are within the first probability density region 302, namely are less than the first signal metric transition 328, the pipeline ADC scales the analog input signal in accordance with a first gain factor $G_1$. The second probability density region 320 corresponds to the one or more signal metrics of the analog input signal being between the first signal metric transition 328 and a second signal metric transition 330. When the one or more signal metrics of the analog input signal are within the second probability density region 320, namely between the first signal metric transition 328 and the second signal metric transition 330, the pipeline ADC scales the analog input signal in accordance with a second gain factor $G_2$. The third probability density region 322 corresponds to the one or more signal metrics of the analog input signal being between the second signal metric transition 330 and a third signal metric transition 332. When the one or more signal metrics of the analog input signal are within the second probability density region 320, namely between the second signal metric transition 330 and a third signal metric transition 332, the pipeline ADC scales the analog input signal in accordance with a third gain factor $G_3$. The fourth probability density region 324 corresponds to the one or more signal metrics of the analog input signal being between the third signal metric transition 332 and a fourth signal metric transition 334. When the one or more signal metrics of the analog input signal are within the fourth probability density region 324, namely between the second signal metric transition 330 and a third signal metric transition 332, the pipeline ADC scales the analog input signal in accordance with a fourth gain factor $G_4$. The fifth probability density region 326 corresponds to the one or more signal metrics of the analog input signal being greater than the fourth signal metric transition 334. When the one or more signal metrics of the analog input signal are within the fifth probability density region 326, namely are greater than the fourth signal metric transition 334, the pipeline ADC scales the analog input signal in accordance with a fifth gain factor $G_5$.

The first signal metric transition 328, the second signal metric transition 330, the third signal metric transition 332, and the fourth signal metric transition 334 are selectively chosen such that a digital output signal, such as the digital output signal 252 to provide an example, accurately represents the analog input signal in a substantially similar manner as the first signal metric transition 308 and the second signal metric transition 310. For example, the first signal metric transition 328, the second signal metric transition 330, the third signal metric transition 332, and the fourth signal metric transition 334 can be selectively chosen to attempt to minimize the exemplary averaged input noise component 314 as discussed in FIG. 3A. As another example, the first signal metric transition 328, the second signal metric transition 330, the third signal metric transition 332, and the fourth signal metric transition 334 are positioned such that the analog input signal, when within the first probability density region 318, the second probability density region 320, the fourth probability density region 324, and/or the fifth probability density region 326 does not cause the pipeline ADC to saturate or clip as discussed in FIG. 3A.

FIG. 3C illustrates a third exemplary operation of the gain control logic module that can be implemented as part of the exemplary pipeline ADC according to an exemplary embodiment of the present disclosure. As shown in FIG. 3C, the exemplary probability density function 300 can be separated or partitioned into a probability density regions 340.1 through 340.$n$. Often times, one or more the probability density regions 340.1 through 340.$n$ can each occupy a substantially similar range of probabilities; however, those skilled in the relevant art(s) will recognize that one or more of the probability density regions 340.1 through 340.$n$ can occupy different ranges of probabilities without departing from the spirit and scope of the present disclosure.

The first probability density region 340.1 corresponds to one or more signal metrics of the analog input signal being less than a first signal metric transition 342.1. When the one or more signal metrics of analog input signal are within the first probability density region 340.1, namely are less than the first signal metric transition 342.1, the pipeline ADC scales the analog input signal in accordance with a first gain factor $G_1$. The probability density regions 340.2 through 340.($n$−1) correspond to the one or more signal metrics of the analog input signal between a first corresponding signal metric transition from among the signal metric transitions 342.1 through 342.$m$ and a second corresponding signal metric transition from among the signal metric transitions 342.1 through 342.$m$. When the one or more signal metrics of the analog input signal are within a corresponding one of the probability density regions 340.2 through 340.($n$−1), namely between the first corresponding signal metric transition and the second corresponding signal metric transition, the pipeline ADC scales the analog input signal in accordance with a corresponding gain factor $G_2$ through $G_{N-1}$. The $n^{th}$ probability density region 340.$n$ corresponds to the one or more signal metrics of the analog input signal being greater than the $m^{th}$ signal metric transition 342.$m$. When the one or more signal metrics of the analog input signal are within the $n^{th}$ probability density region 340.2, namely are greater than the $m^{th}$ signal metric transition 342.$m$, the pipeline ADC scales the analog input signal in accordance with a nth gain factor $G_N$.

The probability density regions 340.1 through 340.$n$ are selectively chosen such that a digital output signal, such as the digital output signal 252 to provide an example, accurately represents the analog input signal in a substantially similar manner as the first signal metric transition 308 and the second signal metric transition 310. For example, the probability density regions 340.1 through 340.$n$ can be selectively chosen to attempt to minimize the exemplary averaged input noise component 314 as discussed in FIG. 3A. As another example, the probability density regions 340.1 through 340.$n$ are positioned such that the analog input signal, when within one of the probability density regions 340.1 through 340.$n$, does not cause the pipeline ADC to saturate or clip as discussed in FIG. 3A.

Second Exemplary Pipeline Analog-to-Digital Converter (ADC)

Figure 4:
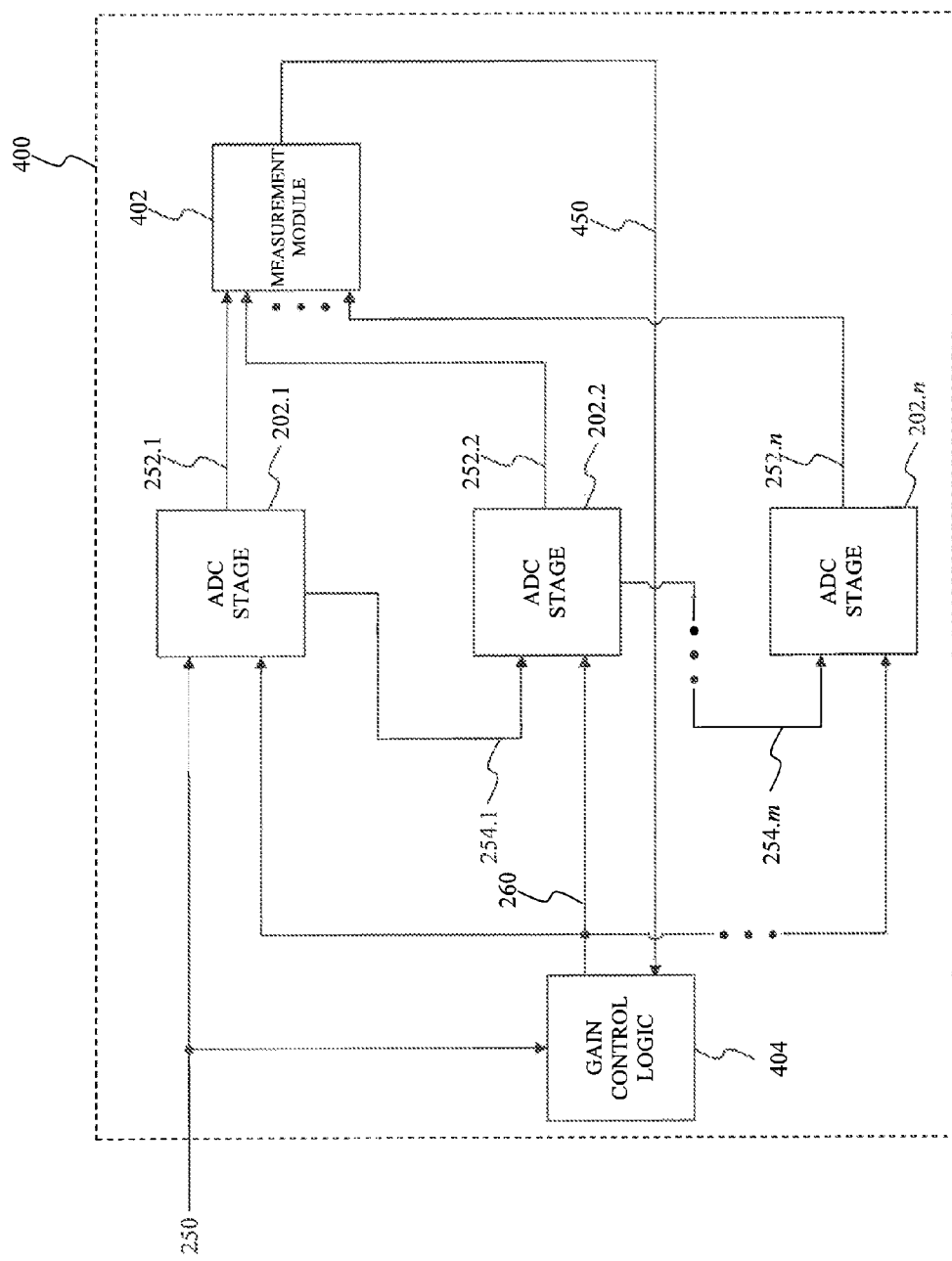
FIG. 4 illustrates a block diagram of a second exemplary pipeline analog-to-digital converter (ADC) according to an exemplary embodiment of the present disclosure.

FIG. 4 illustrates a block diagram of a second exemplary pipeline analog-to-digital converter (ADC) according to an exemplary embodiment of the present disclosure. A pipeline analog-to-digital converter (ADC) 400 converts the analog input signal 250 from a representation in an analog signal domain to a representation in a digital signal domain to provide the digital output signal 252. The pipeline ADC 400 includes the ADC stages 202.1 through 202.$n$, a signal metric measurement module 402, and a gain control logic module 404. The pipeline ADC 400 shares many features in common with the pipeline ADC 200; therefore, only differences between the pipeline ADC 200 and the pipeline ADC 400 are to be discussed in further detail below.

The measurement module 402 determines one or more output signal metric of one or more of the digital output signals 252.1 through 252.$n$. The one or more output signal metric can include a signal-to-noise ratio (SNR), a signal-to-interference plus noise ratio (SINR), an average noise power, such as the exemplary averaged output noise 316 to provide an example, an instantaneous noise power, a mean noise power, a variance in noise power, a total noise power, a root mean square noise power, a norm and/or any other suitable signal metric that will be apparent by those skilled in the relevant art(s) provide some examples. The measurement module 402 provides one or more signal metric transitions 450, such as the first signal metric transition 308, the second signal metric transition 310, the first signal metric transition 328, the second signal metric transition 330, the third signal metric transition 332, the fourth signal metric transition 332, the fifth signal metric transition 334, and/or one or more of the signal metric transitions 342.1 through 342.$m$ based upon the one or more output signal metrics of one or more of the digital output signals 252.1 through 252.$n$.

Typically, the measurement module 402 determines one or more output signal metrics of one or more of the digital output signals 252.1 through 252.$n$. The measurement module 402 can compare the one or more output signal metrics and one or more thresholds to provide an error. The measurement module 402 can determine the one or more signal metric transitions 450 to attempt to minimize this error. The measurement module 402 may generate the one or more signal metric transitions 450 using the Least Mean Squared (LMS), Recursive Least Squares (RLS), Minimum Mean Squared Error (MMSE) algorithms or any suitable algorithm that yields a result which minimizes an error quantified by some metric, such as a minimum-mean-square error to provide an example, that will be apparent to those skilled in the relevant art(s) without departing from the spirit and scope of the present disclosure. Thereafter, the measurement module 402 can provide the one or more signal metric transitions 450 to the gain control logic module 404.

The measurement module 402 can adjust the signal metric transitions 450 to compensate for environmental conditions, such as humidity, precipitation, temperature or any other environmental condition that will be apparent to those skilled in the relevant art(s) without departing from the spirit and scope of the present disclosure as well as to calibrate the pipeline ADC 400 to compensate for manufacturing tolerances present in semiconductor fabrication. In some situations, the measurement module 402 can be implemented as part of automatic test equipment (ATE) that is communicatively coupled to the ADC stages 202.1 through 202.n and the gain control logic module 404 to allow for factory calibration of the pipeline ADC 400. Additionally, the measurement module 402 can increase and/or decrease a number of the probability density regions being utilized by the gain control logic module 404.

The gain control logic module 404 operates in a substantially similar manner as the gain control logic 212; however, instead of accessing the various probability density regions from within a memory, the various probability density regions utilized by the gain control logic module 404 are provided by the measurement module 402 as the signal metric transitions 450.

Exemplary Operational Steps of the Second Exemplary Pipeline ADC

Figure 5:
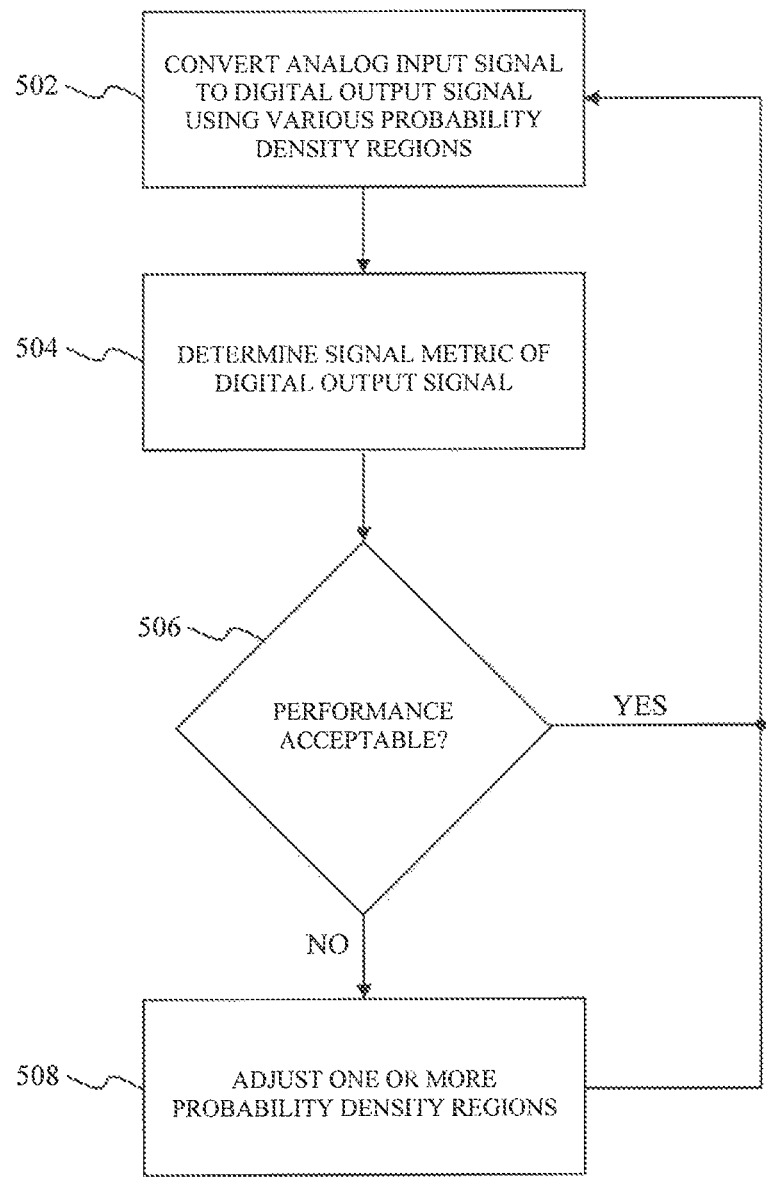
FIG. 5 is a flowchart of exemplary operational steps of the second exemplary pipeline ADC.

FIG. 5 is a flowchart of exemplary operational steps of the second exemplary pipeline ADC. The disclosure is not limited to this operational description. Rather, it will be apparent to persons skilled in the relevant art(s) from the teachings herein that other operational control flows are within the scope and spirit of the present disclosure. The following discussion describes the steps in FIG. 5.

At step 502, the operational control flow converts an analog input signal, such as the analog input signal 250 to provide an example, from a representation in an analog signal domain to a representation in a digital signal domain to provide a digital output signal, such as the digital output signals 252.1 through 252.n to provide an example. The operational control flow determines one or more input signal metrics of the analog input signal, such as a mean, a total energy, an average power, a mean square, an instantaneous power, a root mean square, a variance, a norm, a voltage level and/or any other suitable signal metric that will be apparent by those skilled in the relevant art(s) provide some examples. Next, the operational control flow compares the one or more signal metrics with various probability density regions of an exemplary probability density function for one or more input signal metrics of the analog input signal to determine a corresponding probability density region. Thereafter, the operational control flow selects a corresponding gain factor that corresponds to the corresponding probability density region from among multiple possible gain factors and scales various signals in accordance with this gain factor.

At step 504, the operational control flow determines one or more output signal metrics of one or more of the digital output signal from step 502. The one or more output signal metrics can include a signal-to-noise ratio (SNR), a signal-to-interference plus Noise Ratio (SINR), an average noise power, such as the exemplary averaged output noise 316 to provide an example, an instantaneous noise power, a mean noise power, a variance in noise power, a total noise power, a root mean square noise power, a norm and/or any other suitable signal metric that will be apparent by those skilled in the relevant art(s) provide some examples.

At step 506, the operational control flow determines whether its performance is acceptable. Typically, the operational control flow compares the one or more output signal metrics and one or more thresholds to provide an error. The performance is determined to be acceptable when the error is within a range of acceptable values, such as less than a first threshold and/or or greater than a second threshold. The operational control flow reverts to step 502 when its performance is acceptable. Otherwise, the operational control flow proceeds to step 508.

At step 508, the operational control flow adjusts one or more of the various probability density regions of step 502. Each of the various probability density regions of step 502 can be characterized as being bounded by one or more signal metric transitions, such as the first signal metric transition 308, the second signal metric transition 310, the first signal metric transition 328, the second signal metric transition 330, the third signal metric transition 332, the fourth signal metric transition 332, the fifth signal metric transition 334, and/or one or more of the signal metric transitions 342.1 through 342.m. The operational control flow can adjust the corresponding one or more signal metric transitions of one or more of the various probability density regions to adjust the various probability density regions of step 502. Typically, the operational control flow adjusts one or more of the various probability density regions of step 502 to attempt to minimize the error of step 506. The measurement module 402 may adjust the one or more of the various probability density regions using the Least Mean Squared (LMS), Recursive Least Squares (RLS). Minimum Mean Squared Error (MMSE) algorithms or any suitable algorithm that yields a result which minimizes an error quantified by some metric, such as a minimum-mean-square error to provide an example, that will be apparent to those skilled in the relevant art(s) without departing from the spirit and scope of the present disclosure. After adjusting the one or more of the various probability density regions of step 502, the operational control flow reverts to step 502.

Figure 6:
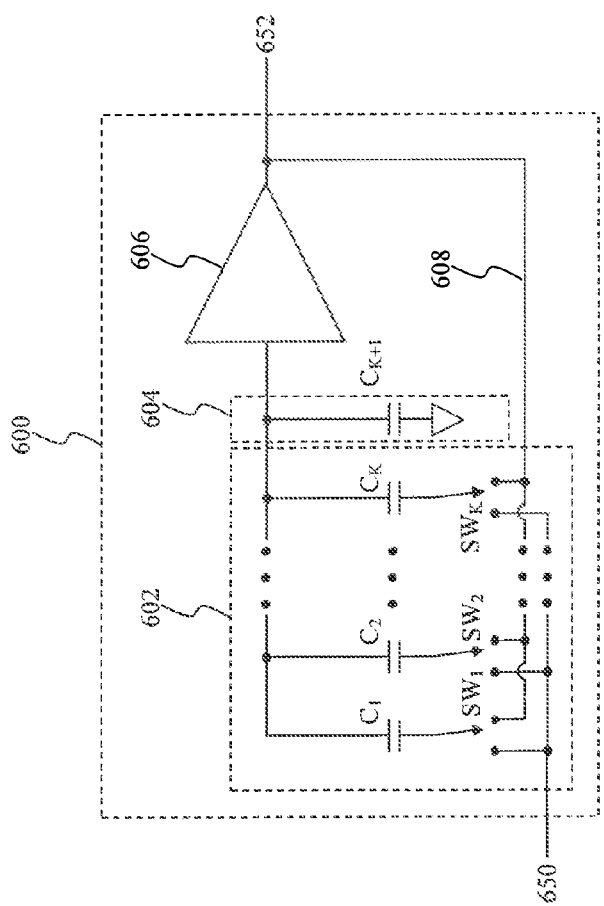
FIG. 6 illustrates a block diagram of an exemplary amplifier module that can be implemented as part of the first or the second exemplary pipeline ADCs according to an exemplary embodiment of the present disclosure.

Exemplary Amplifier Module that can be Implemented as Part of the First or the Second Exemplary Pipeline ADCS FIG. 6 illustrates a block diagram of an exemplary amplifier module that can be implemented as part of the first or the second exemplary pipeline ADCs according to an exemplary embodiment of the present disclosure. An amplifier module 600 amplifies an analog input signal 650 in accordance with a gain factor, to provide an analog output signal 652. The amplifier module 600 includes a switchable capacitor bank 602, a non-switchable capacitor bank 604, and an amplifier module 606. The amplifier module 600 can represent an exemplary embodiment of the amplifier module 210.

The switchable capacitor bank 602 includes capacitors $C_1$ through $C_K$, each of the capacitors $C_1$ through $C_K$ being coupled to a corresponding switch $SW_1$ through $SW_K$. Each of the switches $SW_1$ through $SW_K$ couples its corresponding capacitor $C_1$ through $C_K$ to the analog input signal 650 when in a first state or position. Otherwise, each of the switches $SW_1$ through $SW_K$ couples its corresponding capacitor $C_1$ through $C_K$ to a feedback path 608 when in a second state or position.

The non-switchable capacitor bank 604 includes a capacitor $C_{K+1}$ which is coupled between an input of the amplifier module 606 and a ground potential. Although the non-switchable capacitor bank 604 is illustrated as including a single capacitor $C_{K+1}$, those skilled in the relevant art(s) will recognize that the non-switchable capacitor bank 604 can include any suitable number of capacitors without departing from the spirit and scope of the present disclosure.

The amplifier module 606 can operate in a sampling mode of operation or an amplifying mode of operation. In the sampling mode of operation, each of the switches $SW_1$ through $SW_K$ couples its corresponding capacitor $C_1$ through $C_K$ to the analog input signal 650. This allows the analog input signal 650 to charge the capacitors $C_1$ through $C_K$ to sample the analog input signal 650. In the amplifying mode of operation, a first group of one or more of the switches $SW_1$ through $SW_K$ couples its corresponding capacitor $C_1$ through $C_K$ to the analog input signal 650 and a second group of one or more of the switches $SW_1$ through $SW_K$ couples its corresponding capacitor $C_1$ through $C_K$ to the feedback path 608. The amplifier module 606 amplifies the analog input signal 650 by a gain factor that corresponds to a ratio of the second group to the first group. Typically, a gain control logic module, such as the gain control logic module 212 or the gain control logic module 404 to provide some examples, can provide a control signal, such as the gain factor 260 to provide an example, to configure the capacitors $C_1$ through $C_K$ as being either in the first group or the second group.

CONCLUSION

It is to be appreciated that the Detailed Description section, and not the Abstract section, is intended to be used to interpret the claims. The Abstract section may set forth one or more, but not all exemplary embodiments, of the present disclosure, and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the present disclosure should not be limited by any of the above-described exemplary embodiments, but should be defined only in accordance with the following claims and their equivalents.

What is claimed is:

1. A pipeline analog-to-digital converter (ADC) for converting an analog input signal from an analog signal domain to a digital signal domain to provide a plurality of digital output signals, comprising:
   a first ADC stage configured to:
      convert the analog input signal from the analog signal domain to the digital signal domain to provide a first digital output signal from among the plurality of digital output signals,
      determine a first difference between the analog input signal and an analog representation of the first digital output signal, and
      scale the first difference by a gain factor to provide a first analog residual signal from among a plurality of analog residual signals;
   a second ADC stage configured to:
      convert the first analog residual signal from the analog signal domain to the digital signal domain to provide a second digital output signal from among the plurality of digital output signals,
      determine a second difference between the first analog residual signal and an analog representation of the second digital output signal, and
      scale the second difference by the gain factor to provide a second analog residual signal from among the plurality of analog residual signals; and
   a gain control logic module configured to determine a signal metric of the analog input signal and to select the gain factor that corresponds to the signal metric from among a plurality of gain factors.

2. The pipeline ADC of claim 1, wherein the gain control logic module is configured to select a first gain factor from among the plurality of gain factors as the gain factor when the signal metric is between a first signal metric transition and a second signal metric transition or a second gain factor from among the plurality of gain factors as the gain factor when the signal metric is between the second signal metric transition and a third signal metric transition.

3. The pipeline ADC of claim 2, wherein the first gain factor is less than the second gain factor.

4. The pipeline ADC of claim 2, wherein the first and the second signal metric transitions are selectively chosen such that the pipeline ADC does not saturate when the analog input signal is between the first signal metric transition and the second signal metric transition, and
   wherein the second and the third signal metric transitions are selectively chosen such that the pipeline ADC does not saturate when the analog input signal is between the second signal metric transition and the third signal metric transition.

5. The pipeline ADC of claim 2, further comprising:
   a signal metric measurement module configured to:
      determine a second signal metric of the first digital output signal or the second digital output signal,
      compare the second signal metric to a threshold to provide an error, and
      determine at least one of the first signal metric transition, the second signal metric transition, or the third signal metric transition to attempt to minimize the error.

6. The pipeline ADC of claim 5, wherein the second signal metric comprises:
   a signal-to-noise ratio (SNR);
   a signal-to-interference plus noise ratio (SINR);
   an average noise power;
   an instantaneous noise power;
   a mean noise power;
   a variance in noise power;
   a total noise power;
   a root mean square noise power; or
   a norm.

7. The pipeline ADC of claim 1, wherein the analog input signal is characterized by a probability density function, and
   wherein the gain control logic module is configured to select a first gain factor from among the plurality of gain factors as the gain factor when the signal metric corresponds to a first probability density region from among a plurality of probability density regions or a second gain factor from among the plurality of gain factors as the gain factor when the signal metric corresponds to a second probability density region from among the plurality of probability density regions.

8. The pipeline ADC of claim 7, wherein the first gain factor is less than the second gain factor.

9. The pipeline ADC of claim 7, wherein the first and the second probability density regions are selectively chosen such that the pipeline ADC does not saturate when the analog input signal is within the first probability density region and the second probability density region.

10. The pipeline ADC of claim 1, further comprising:
a third ADC stage configured to:
convert the second analog residual signal from the analog signal domain to the digital signal domain to provide a third digital output signal from among the plurality of digital output signals,
determine a third difference between the second analog residual signal and an analog representation of the third digital output signal, and
scale the third difference by the gain factor to provide a third analog residual signal from among the plurality of analog residual signals.

11. The pipeline ADC of claim 1, wherein the signal metric comprises:
a mean of the analog input signal;
a total energy of the analog input signal;
an average power of the analog input signal;
a mean square of the analog input signal;
an instantaneous power of the analog input signal;
a root mean square of the analog input signal;
a variance of the analog input signal; or
a norm of the analog input signal.

12. A pipeline analog-to-digital converter (ADC) for converting an analog input signal to a plurality of digital output signals, comprising:
a first ADC stage configured to:
convert the analog input signal to provide a first digital output signal from among the plurality of digital output signals, and
scale a first difference between the analog input signal and an analog representation of the first digital output signal by a first gain factor when a signal metric of the analog signal is less than a first signal metric transition or by a second gain factor when the signal metric is greater than the first signal metric transition to provide a first analog residual signal from among a plurality of analog residual signals, the first gain factor being greater than the second gain factor; and
a second ADC stage configured to:
convert the first analog residual signal to provide a second digital output signal from among the plurality of digital output signals, and
scale a second difference between the first analog residual signal and an analog representation of the second digital output signal by the first gain factor when the signal metric of the analog signal is less than the first signal metric transition or by the second gain factor when the signal metric is greater than the first signal metric transition to provide a second analog residual signal from among the plurality of analog residual signals.

13. The pipeline ADC of claim 12, wherein the first ADC stage comprises:
an ADC configured to convert the analog input signal to provide the first digital output signal;
a digital-to-analog converter (DAC) configured to convert the first digital output signal to provide the analog representation of the first digital output signal;
a combination module configured to subtract the analog input signal from the analog representation of the first digital output signal to provide the first difference; and
an amplifier module configured to amplify the first difference by either the first gain or the second gain to provide the first analog residual signal.

14. The pipeline ADC of claim 12, wherein the first signal metric transition is selectively chosen such that the pipeline ADC does not saturate when the analog input signal is between the first signal metric transition and a second signal metric transition.

15. The pipeline ADC of claim 12, wherein the first ADC stage is further configured to scale the first difference by the second gain factor when the signal metric is greater than the first signal metric transition and less than a second signal metric transition or by a third gain factor when the signal metric is greater than the second signal metric transition.

16. The pipeline ADC of claim 15, wherein the first gain factor is substantially equal to the third gain factor, and
wherein the first gain factor and the third gain factor are less than the second gain factor.

17. A method for converting an analog input signal to a digital output signal, comprising:
converting, by a pipeline analog-to-digital converter (ADC), the analog input signal to the digital output signal using a gain factor associated with a corresponding probability density region from among a plurality of probability density regions;
determining, by the pipeline ADC, a signal metric of the digital output signal;
determining, by the pipeline ADC, whether a performance is acceptable when the gain factor associated with the corresponding probability density region is used to convert the analog input signal; and
adjusting, by the pipeline ADC, the corresponding probability density region when the performance is not acceptable.

18. The method of claim 17, wherein the converting comprises:
selecting a first gain factor from among a plurality of gain factors as the gain factor when the signal metric corresponds to a first probability density region from among the plurality of probability density regions or a second gain factor from among the plurality of gain factors as the gain factor when the signal metric corresponds to a second probability density region from among the plurality of probability density regions.

19. The method of claim 17, wherein the determining whether the performance is acceptable comprises:
comparing the signal metric and a threshold to provide an error; and
determining the performance to be acceptable when the error is within a range of acceptable values.

20. The method of claim 19, wherein the adjusting comprises:
adjusting the corresponding probability density region to attempt to minimize the error.

21. The method of claim 19, wherein the adjusting comprises:
adjusting the corresponding probability density region using at least one of:
a Least Mean Squared (LMS) algorithm;
a Recursive Least Squares (RLS) algorithm; or
a Minimum Mean Squared Error (MMSE) algorithm.

* * * * *